(12) United States Patent
Kang

(10) Patent No.: US 12,408,348 B2
(45) Date of Patent: Sep. 2, 2025

(54) SEMICONDUCTOR DEVICE AND MANUFACTURING METHOD THEREOF

(71) Applicant: SK hynix Inc., Icheon-si (KR)

(72) Inventor: Byung Woo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 516 days.

(21) Appl. No.: 17/837,788

(22) Filed: Jun. 10, 2022

(65) Prior Publication Data

US 2023/0217662 A1    Jul. 6, 2023

(30) Foreign Application Priority Data

Jan. 3, 2022 (KR) .................. 10-2022-0000606

(51) Int. Cl.
*H10B 53/20* (2023.01)
(52) U.S. Cl.
CPC .................. *H10B 53/20* (2023.02)
(58) Field of Classification Search
CPC ........ H10B 53/20; H10B 43/35; H10B 43/27; H10B 43/40; G11C 16/0483; H01L 28/60
See application file for complete search history.

(56) References Cited

U.S. PATENT DOCUMENTS

2020/0381447 A1* 12/2020 Kim ............... H10B 43/27

FOREIGN PATENT DOCUMENTS

| KR | 1020200113871 A | 10/2020 |
| KR | 1020200137699 A | 12/2020 |
| KR | 1020210011789 A | 2/2021 |

* cited by examiner

*Primary Examiner* — Britt D Hanley
*Assistant Examiner* — William C. Trice, III
(74) *Attorney, Agent, or Firm* — WILLIAM PARK & ASSOCIATES LTD.

(57) ABSTRACT

A semiconductor device and a method of manufacturing the semiconductor includes a first source layer spaced apart from a substrate and disposed in a memory cell region of the substrate, a second source layer spaced apart from the substrate and disposed in a contact region of the substrate, a cell stacked structure including interlayer insulating layers and conductive patterns alternately stacked on each other over the first source layer, a discharge contact passing through at least a part of the second source layer, and a dielectric layer disposed between the second source layer and the discharge contact.

19 Claims, 15 Drawing Sheets

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2022-0000606, filed on Jan. 3, 2022, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor device and a manufacturing method of the semiconductor device.

2. Related Art

Non-volatile memory devices retain stored data even in the absence of supplied power. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

Three-dimensional non-volatile memory devices may include interlayer insulating layers and gate electrodes alternately stacked on each other and channel layers passing through the interlayer insulating layers and the gate electrodes, and memory cells may be stacked along the channel layers. Various structures and manufacturing methods have been developed to improve the operational reliability of three-dimensional non-volatile memory devices.

SUMMARY

According to an embodiment of the present disclosure, a semiconductor device may include a first source layer spaced apart from a substrate and disposed in a memory cell region of the substrate, a second source layer spaced apart from the substrate and disposed in a contact region of the substrate, a cell stacked structure including interlayer insulating layers and conductive patterns alternately stacked on each other over the first source layer, a discharge contact passing through at least a part of the second source layer, and a dielectric layer disposed between the second source layer and the discharge contact.

According to an embodiment of the present disclosure, a semiconductor device may include a source layer spaced apart from a substrate and disposed in a memory cell region and a contact region of the substrate, a cell stacked structure including interlayer insulating layers and conductive patterns alternately stacked on each other over the source layer in the memory cell region, a channel structure passing through at least a part of the cell stacked structure and extending into the source layer in the memory cell region, an electrode for a capacitor passing through at least a part of the source layer in the contact region, and a dielectric layer disposed between the source layer and the electrode for the capacitor.

According to an embodiment of the present disclosure, a method of manufacturing a semiconductor device may include forming a source layer over a substrate including a memory cell region and a contact region, forming a contact hole passing through the source layer in the contact region, forming a dielectric layer on a sidewall of the contact hole, filling the contact hole with a conductive material, forming a stacked structure in which first material layers and second material layers are alternately stacked on each other over the source layer and the conductive material, and forming a plurality of channel holes passing through the stacked structure to extend into the source layer.

DETAILED DESCRIPTION

Specific structural or functional descriptions disclosed herein are merely illustrative for the purpose of describing embodiments according to the concept of the present disclosure. Embodiments according to the concept of the present disclosure may be implemented in various forms and should not be construed as being limited to the specific embodiments set forth herein.

Hereinafter, embodiments are described with reference to the accompanying drawings in order for those skilled in the art to be able to implement the technical spirit of the present disclosure.

Various embodiments are directed to a semiconductor device capable of utilizing, as a capacitor, a discharge contact for discharging charges accumulated in a source layer of the semiconductor device and a method of manufacturing the semiconductor device.

Figure 1:
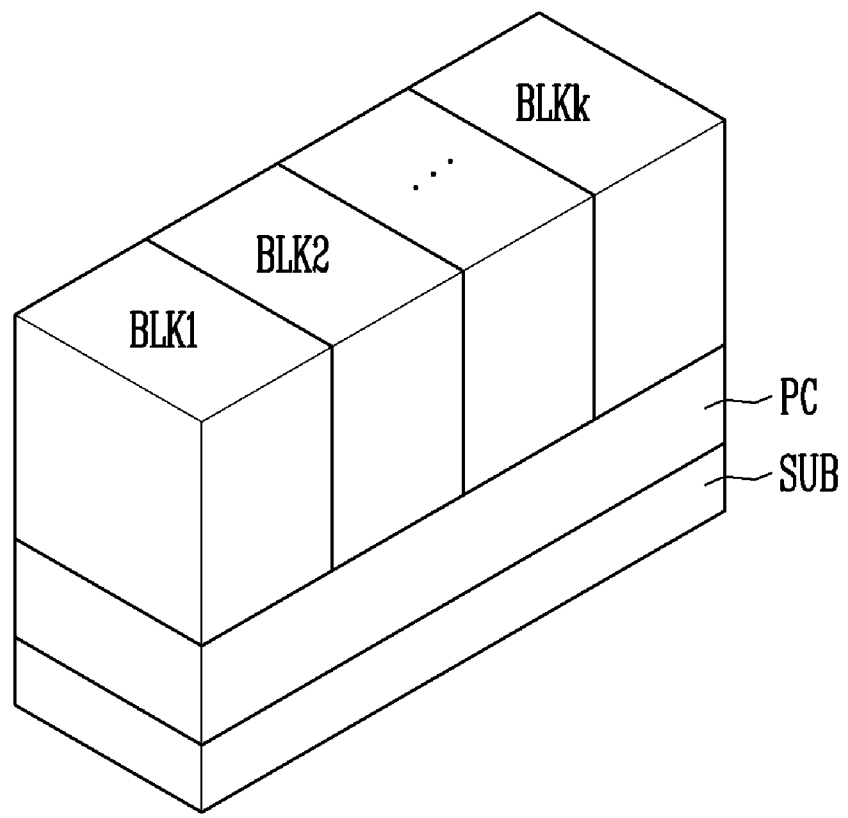
FIG. 1 is a block diagram illustrating a semiconductor device according to an embodiment.

FIG. 1 is a block diagram illustrating a semiconductor device according to an embodiment.

Referring to FIG. 1, the semiconductor device may include a peripheral circuit structure PC and memory blocks BLK1 to BLKk that are disposed over a substrate SUB, where k is a natural number of 2 or more. The memory blocks BLK1 to BLKk may overlap the peripheral circuit structure PC.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method.

The peripheral circuit structure PC may include a row decoder, a column decoder, a page buffer, and a control circuit that form a circuit for controlling the operation of the memory blocks BLK1 to BLKk. For example, the peripheral circuit structure PC may include an NMOS transistor, a PMOS transistor, a resistor, and a capacitor that are electrically coupled to the memory blocks BLK1 to BLKk. The peripheral circuit structure PC may be disposed between the substrate SUB and the memory blocks BLK1 to BLKk. However, the present disclosure does not exclude an embodiment in which the peripheral circuit structure PC extends to a region of the substrate SUB which does not overlap with the memory blocks BLK1 and BLKk.

Each of the memory blocks BLK1 to BLKk may include impurity-doped regions, bit lines, cell strings electrically coupled to the impurity-doped regions and the bit lines, word lines electrically coupled to the cell strings, and select lines electrically coupled to the cell strings. Each of the cell strings may include memory cells and select transistors that are coupled in series to each other by a channel structure. Each of the select lines may serve as a gate electrode of a corresponding one of the select transistors. Each of the word lines may serve as a gate electrode of a corresponding one of the memory cells.

Figure 2:
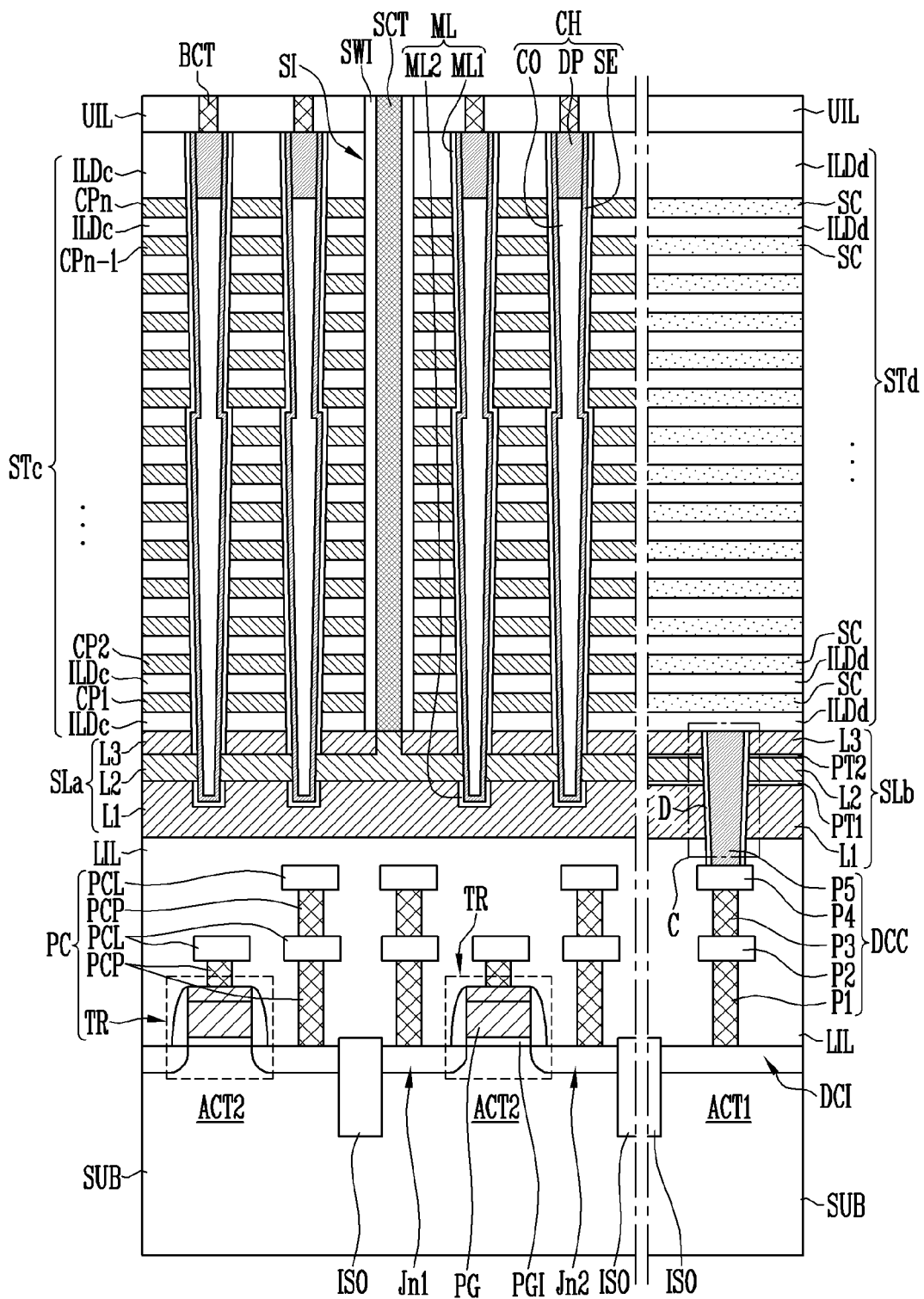
FIG. 2 is a cross-sectional diagram illustrating a semiconductor device according to an embodiment.

FIG. 2 is a cross-sectional diagram illustrating a semiconductor device according to an embodiment.

Referring to FIG. 2, the semiconductor device may include source layers SLa and SLb disposed over the substrate SUB, a cell stacked structure STc disposed over the source layer SLa, a dummy stacked structure STd disposed over the source layer SLb, and a discharge contact DCC passing through a region of the source layer SLb that overlaps the dummy stacked structure STd and extending downwards. For example, a region of the substrate SUB in which the source layer SLa and the cell stacked structure STc are formed may be defined as a memory cell region and a region of the substrate SUB in which the source layer SLb, the dummy stacked structure STd, and the discharge contact DCC are formed may be defined as a contact region.

The substrate SUB may include the same material as the substrate SUB described above with reference to FIG. 1. Conductive dopants defining a well region may be injected into the substrate SUB. The conductive dopants defining the well region may be an n-type impurity or a p-type impurity. The well region of the substrate SUB may be divided into active regions ACT1 and ACT2 defined by isolation layers ISO. The isolation layers ISO may include an insulating material embedded in the substrate SUB. The active regions ACT1 and ACT2 may include a first active region ACT1 overlapping with the discharge contact DCC and one or more second active regions ACT2 overlapping with the cell stacked structure STc.

The source layers SLa and SLb may be disposed to be spaced apart from the substrate SUB by the peripheral circuit structure PC and a lower insulating structure LIL that are interposed between the source layers SLa and SLb and the substrate SUB.

The peripheral circuit structure PC may include a transistor TR as described above with reference to FIG. 1. The transistor TR may include a peripheral-gate insulating layer PGI disposed over the second active region ACT2, a peripheral-gate electrode PG disposed over the peripheral-gate insulating layer PGI, and first and second junctions Jn1 and Jn2 disposed at opposite sides of the peripheral-gate electrode PG, in the second active region ACT2. The first and second junctions Jn1 and Jn2 may be regions defined by injecting the n-type or p-type impurity into the second active region ACT2. One of the first and second junctions Jn1 and Jn2 may serve as a source junction and the other of the first and second junctions Jn1 and Jn2 may serve as a drain junction.

The peripheral circuit structure PC may include connecting lines PCL and peripheral contact plugs PCP that are coupled to the transistor TR. As described above with reference to FIG. 1, the peripheral circuit structure PC may include a resistor and a capacitor in addition to the transistor TR and the connecting lines PCL and the peripheral contact plugs PCP that are coupled to the transistor TR.

A conductive impurity may be injected into the first active region ACT1. According to an embodiment, a discharge impurity region DCI may be defined in the first active region ACT1. The discharge impurity region DCI may include conductive impurities forming a PN diode. The discharge impurity region DCI may be used as a path through which charges accumulated in the source layers SLa and SLb are discharged.

The above-described peripheral circuit structure PC may be covered with the lower insulating structure LIL disposed between the source layers SLa and SLb and the substrate SUB. The lower insulating structure LIL may extend to cover the discharge impurity region DCI. The lower insulating structure LIL may include multiple insulating layers that are stacked on top of each other.

The source layers SLa and SLb may be disposed over the lower insulating structure LIL. Each of the source layers SLa and SLb may include two or more semiconductor layers L1, L2, and L3.

For example, the source layer SLa may include first, second, and third semiconductor layers L1, L2, and L3 sequentially stacked over the lower insulating structure LIL. Each of the first and second semiconductor layers L1 and L2 may be a doped semiconductor layer including a source dopant. According to an embodiment, each of the first and second semiconductor layers L1 and L2 may include a doped silicon layer including an n-type impurity. The third semiconductor layer L3 may be omitted in some embodiments. The third semiconductor layer L3 may include at least one of an n-type doped silicon layer and an undoped silicon layer.

For example, the source layer SLb may be configured to include the first, second, and third semiconductor layers L1, L2, and L3, a protective layer PT1 stacked between the first and second semiconductor layers L1 and L2, and a protective layer PT2 stacked between the second and third semiconductor layers L2 and L3. Each of the protective layers PT1 and PT2 may include an oxide layer. The second semiconductor layer L2 included in the source layer SLb may be replaced by a sacrificial layer.

The first semiconductor layer L1, the second semiconductor layer L2, and the third semiconductor layer L3 of the source layer SLa may be electrically coupled to the first semiconductor layer L1, the second semiconductor layer L2, and the third semiconductor layer L3 of the source layer SLb, respectively.

The source layer SLb may be penetrated by the discharge contact DCC. The discharge contact DCC may pass through the lower insulating structure LIL to contact the discharge impurity region DCI of the substrate SUB. The discharge contact DCC may directly contact the discharge impurity region DCI and the source layer SLb. The discharge contact DCC may couple the source layer SLb to the discharge impurity region DCI. Accordingly, charges accumulated in the source layers SLa and SLb may be discharged to the substrate SUB through the discharge impurity region DCI via the discharge contact DCC.

The discharge contact DCC may include first, second, third, fourth, and fifth patterns P1, P2, P3, P4, and P5 that are sequentially stacked on top of each other. The first and third patterns P1 and P3 may be disposed in the lower insulating structure LIL and may be respectively disposed in levels in which the peripheral contact plugs PCP are disposed. The second and fourth patterns P2 and P4 may be disposed in the lower insulating structure LIL and may be respectively disposed in levels in which the connecting lines PCL are disposed. The fifth pattern P5 may pass through the source layer SLb and extend into the lower insulating structure LIL to contact the fourth pattern P4.

The dummy stacked structure STd may overlap the discharge contact DCC. The dummy stacked structure STd may extend to cover a first region of the source layer SLb, that overlaps the discharge impurity region DCI, and the discharge contact DCC. The dummy stacked structure STd may include dummy interlayer insulating layers ILDd and sacrificial insulating layers SC alternately stacked on each other over the first region of the source layer SLb and the discharge contact DCC.

A sidewall of the fifth pattern P5 of the discharge contact DCC may be surrounded by a dielectric layer D. The fifth pattern P5, the dielectric layer D, and the source layer SLb may serve as a capacitor C. The capacitor C is described in more detail below with reference to FIG. 3.

The cell stacked structure STc may include interlayer insulating layers ILDc and conductive patterns CP1 to CPn alternately stacked on each other over a second region of the source layer SLa, where n is a natural number of 2 or more. The cell stacked structure STc may be disposed not to overlap the discharge contact DCC. The cell stacked structure STc may be disposed in the same level as the dummy stacked structure STd. The interlayer insulating layers ILDc may be disposed in the same levels as the dummy interlayer insulating layers ILDd and the conductive patterns CP1 to CPn may be disposed in the same levels as the sacrificial insulating layers SC.

The interlayer insulating layers ILDc and the dummy interlayer insulating layers ILDd may include the same material and may be formed by the same process. The sacrificial insulating layers SC may include a material having a different etch rate from the interlayer insulating layers ILDc and the dummy interlayer insulating layers ILDd. For example, the interlayer insulating layers ILDc and the dummy interlayer insulating layers ILDd may include a silicon oxide and the sacrificial insulating layers SC may include a silicon nitride.

Each of the conductive patterns CP1 to CPn may include various conductive materials such as a doped silicon layer, a metal layer, a metal silicide layer, and a barrier layer, and may include two or more conductive materials. For example, each of the conductive patterns CP1 to CPn may include tungsten and a titanium nitride (TiN) layer surrounding a surface of tungsten. Tungsten is low-resistance metal and may lower a resistance of the conductive patterns CP1 to CPn. The titanium nitride (TiN) layer may serve as a barrier layer and may prevent tungsten from directly contacting the interlayer insulating layers ILDc.

The conductive patterns CP1 to CPn may serve as gate electrodes of a cell string. The gate electrodes of the cell string may include source select lines, word lines, and drain select lines. The source select lines may serve as gate electrodes of source select transistors, the drain select lines may serve as gate electrodes of drain select transistors, and the word lines may serve as gate electrodes of memory cells.

The cell stacked structure STc may surround channel structures CH. In other words, the channel structures CH may pass through the cell stacked structure STc and a part of the source layer SLa. Each of the channel structures CH may include a channel semiconductor pattern SE. The channel semiconductor pattern SE may include a silicon layer. A central region of the channel semiconductor pattern SE may be filled with a core insulating layer CO. The core insulating layer CO may be formed to have a smaller height than the channel semiconductor pattern SE. A central region of an upper part of the channel semiconductor pattern SE that extends upwards to protrude farther than the core insulating layer CO may be filled with a doped semiconductor pattern DP disposed on the core insulating layer CO. The doped semiconductor pattern DP may include an n-type doped silicon layer. The channel semiconductor pattern SE of each of the channel structures CH may serve as a channel region of the cell string and the doped semiconductor pattern DP of each of the channel structures CH may serve as a drain junction of the cell string. A sidewall of each of the channel structures CH may be surrounded by a memory layer ML.

The channel structures CH may pass through the cell stacked structure STc and extend into the source layer SLa. A sidewall of each of the channel structures CH that overlaps the source layer SLa may directly contact the source layer SLa. According to an embodiment, the second semiconductor layer L2 of the source layer SLa may directly contact a sidewall of the channel semiconductor pattern SE that overlaps the second semiconductor layer L2. According to the above-described embodiment, the memory layer ML may be divided into a first memory pattern ML1 and a second memory pattern ML2 by the second semiconductor layer L2. The first memory pattern ML1 may be disposed between each of the channel structures CH and the cell stacked structure STc and may extend between each of the channel structures CH and the third semiconductor layer L3. The second memory pattern ML2 may be disposed between each of the channel structures CH and the first semiconductor layer L1.

A slit SI may be filled with a source contact structure SCT. The source contact structure SCT may be spaced apart from the cell stacked structure STc by a sidewall insulating layer SWI formed on a sidewall of the slit SI. The sidewall insulating layer SWI may be penetrated by the source contact structure SCT. The source contact structure SCT may extend to contact the source layer SLa. The source contact structure SCT may include a single type of a conductive material or two or more types of conductive materials. A conductive material for the source contact structure SCT may include a doped silicon layer, a metal layer, a metal silicide layer, and a barrier layer. For example, the source contact structure SCT may include a doped silicon layer contacting the source layer SLa and a metal layer disposed over the doped silicon layer.

An upper insulating layer UIL may include a single insulating layer or two or more insulating layers. For example, the upper insulating layer UIL may include an oxide layer. The upper insulating layer UIL may be penetrated by bit line contact plugs BCT. Each of the bit line contact plugs BCT may be coupled to the doped semiconductor pattern DP of each of the channel structures CH.

Figure 3:
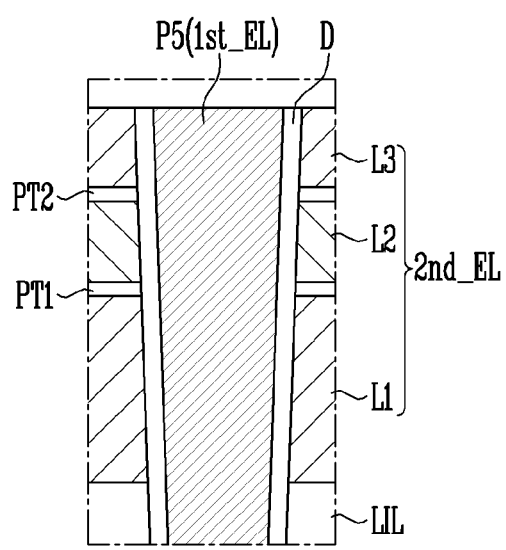
FIG. 3 is an enlarged cross-sectional diagram of a capacitor shown in FIG. 2.

FIG. 3 is an enlarged cross-sectional diagram of the capacitor C shown in FIG. 2.

Referring to FIG. 3, the dielectric layer D may be disposed at an interface between the fifth pattern P5 and the first, second, and third semiconductor layers L1, L2, and L3 of the source layer SLb shown in FIG. 2. For example, the dielectric layer D may be formed to surround a sidewall of the fifth pattern P5 having a cylindrical or frustum shape, a square pillar shape, or a linear pillar shape extending in a first direction parallel to the substrate SUB. The fifth pattern P5 may serve as a first electrode 1st_EL of the capacitor and the first, second, and third semiconductor layers L1, L2, and L3 of the source layer SLb shown in FIG. 2 together may serve as a second electrode 2nd_EL of the capacitor.

In other words, a part of a discharge contact and a source layer penetrated by the discharge contact may serve as electrodes of a capacitor.

FIGS. 4A to 4G are diagrams illustrating a method of manufacturing a semiconductor device according to an embodiment.

Figure 4A:
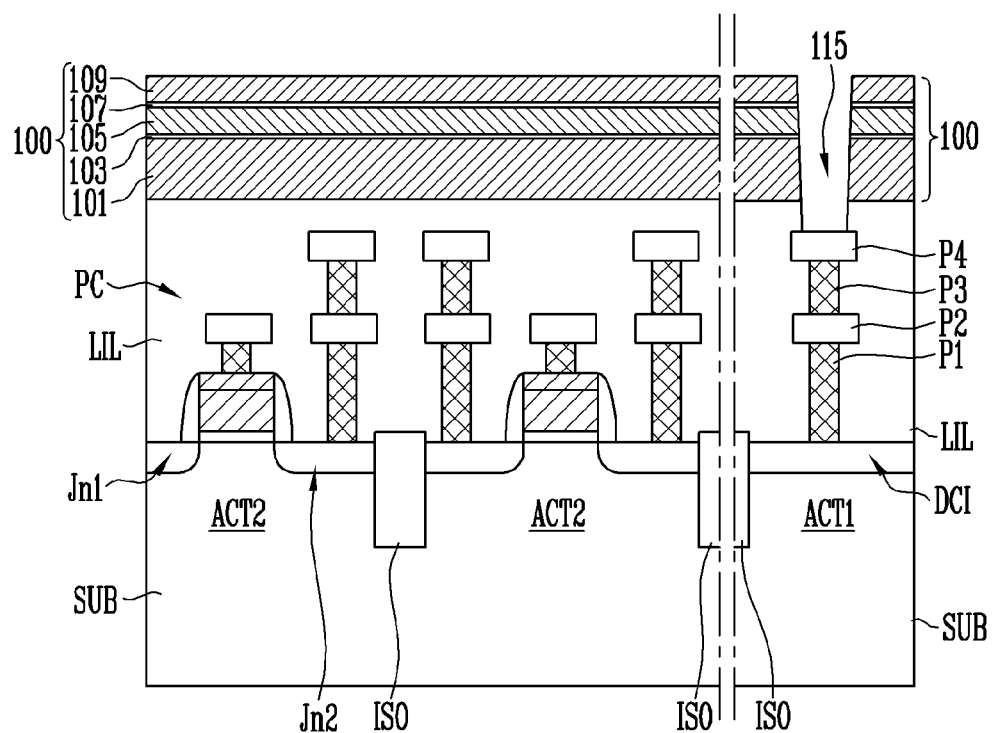
FIGS. 4A to 4G are diagrams illustrating a method of manufacturing a semiconductor device according to an embodiment.

Referring to FIG. 4A, the peripheral circuit structure PC and the first, second, third, and fourth patterns P1, P2, P3, and P4 may be formed over the substrate SUB including the active regions ACT1 and ACT2 that are defined by the isolation layers ISO. The peripheral circuit structure PC and the first, second, third, and fourth patterns P1, P2, P3, and P4 may be covered with the lower insulating structure LIL.

The active regions ACT1 and ACT2 may include the first active region ACT1 and the second active regions ACT2. The first active region ACT1 may include the discharge impurity region DCI and each of the second active regions ACT2 may include the junctions Jn1 and Jn2. A region overlapping the first active region ACT1 may be defined as a contact region and a region overlapping the second active regions ACT2 may be defined as a memory cell region.

The isolation layers ISO, the active regions ACT1 and ACT2, the discharge impurity region DCI, the junctions Jn1 and Jn2, the peripheral circuit structure PC, and the lower insulating structure LIL are described above in detail with reference to FIG. 1 and/or FIG. 2. Accordingly, any repetitive detailed description of each of these components already described above will be omitted for the sake of brevity.

The first, second, third, and fourth patterns P1, P2, P3, and P4 may include a conductive material and may be sequentially stacked over the discharge impurity region DCI. The first pattern P1 that is disposed in the lowermost level among the first, second, third, and fourth patterns P1, P2, P3, and P4 may directly contact the discharge impurity region DCI.

Subsequently, a lower stacked structure 100 may be formed over the lower insulating structure LIL. The lower stacked structure 100 may include a lower semiconductor layer 101, a sacrificial layer 105, and an upper semiconductor layer 109 sequentially stacked over each other. Before the sacrificial layer 105 is deposited over the lower semiconductor layer 101, a first protective layer 103 may be formed on the lower semiconductor layer 101. Before the upper semiconductor layer 109 is formed over the sacrificial layer 105, a second protective layer 107 may be formed over the sacrificial layer 105.

The lower semiconductor layer 101 may include a doped semiconductor layer including a conductive impurity. For example, the lower semiconductor layer 101 may include an n-type doped silicon layer. The sacrificial layer 105 may include a material having a different etch rate from the first protective layer 103 and the second protective layer 107. The first protective layer 103 and the second protective layer 107 may include materials having different etch rates from the lower semiconductor layer 101 and the upper semiconductor layer 109, respectively. For example, the sacrificial layer 105 may include an undoped silicon layer and each of the first protective layer 103 and the second protective layer 107 may include an oxide layer. For example, the upper semiconductor layer 109 may include a doped silicon layer or an undoped silicon layer.

Subsequently, an opening 115 that passes through a part of the lower stacked structure 100 which overlaps the discharge impurity region DCI to expose the lower insulating structure LIL may be formed. A cross section of the opening 115 may have a circular shape, a rectangular shape, or a linear shape extending in a plane parallel to the substrate SUB. The opening 115 may extend into the lower insulating structure LIL to have a predetermined depth. The opening 115 may expose the fourth pattern P4 that is disposed in the uppermost level among the first, second, third, and fourth patterns P1, P2, P3, and P4.

Figure 4B:
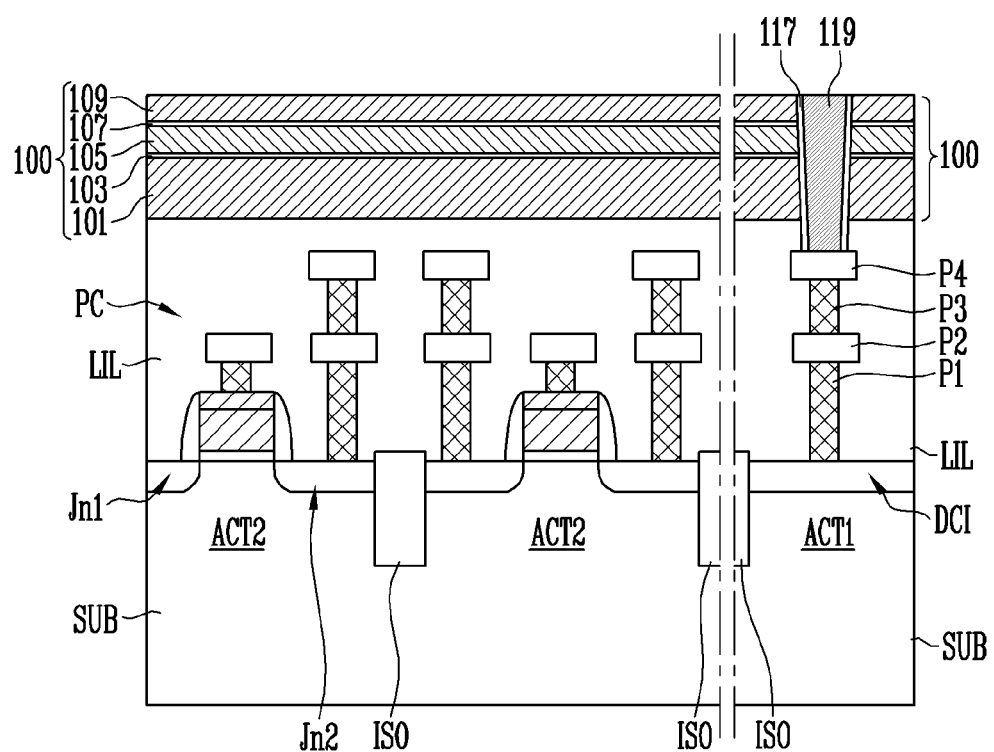

Referring to FIG. 4B, a dielectric layer 117 may be formed on a sidewall of the opening 115 shown in FIG. 4A. A high dielectric material such as $Ta_2O_5$, $Al_2O_3$, $La_2O_3$, $HfO_2$, $SrTiO_3$, BST, and $ZrO_2$ may be used for the dielectric layer 117 or a ferroelectric material such as PZT, BTO, BNT, PLZT, SBT, and BLT may be used for the dielectric layer 117.

Subsequently, a conductive pattern 119 may be formed to completely fill the opening 115 shown in FIG. 4A.

Figure 4C:
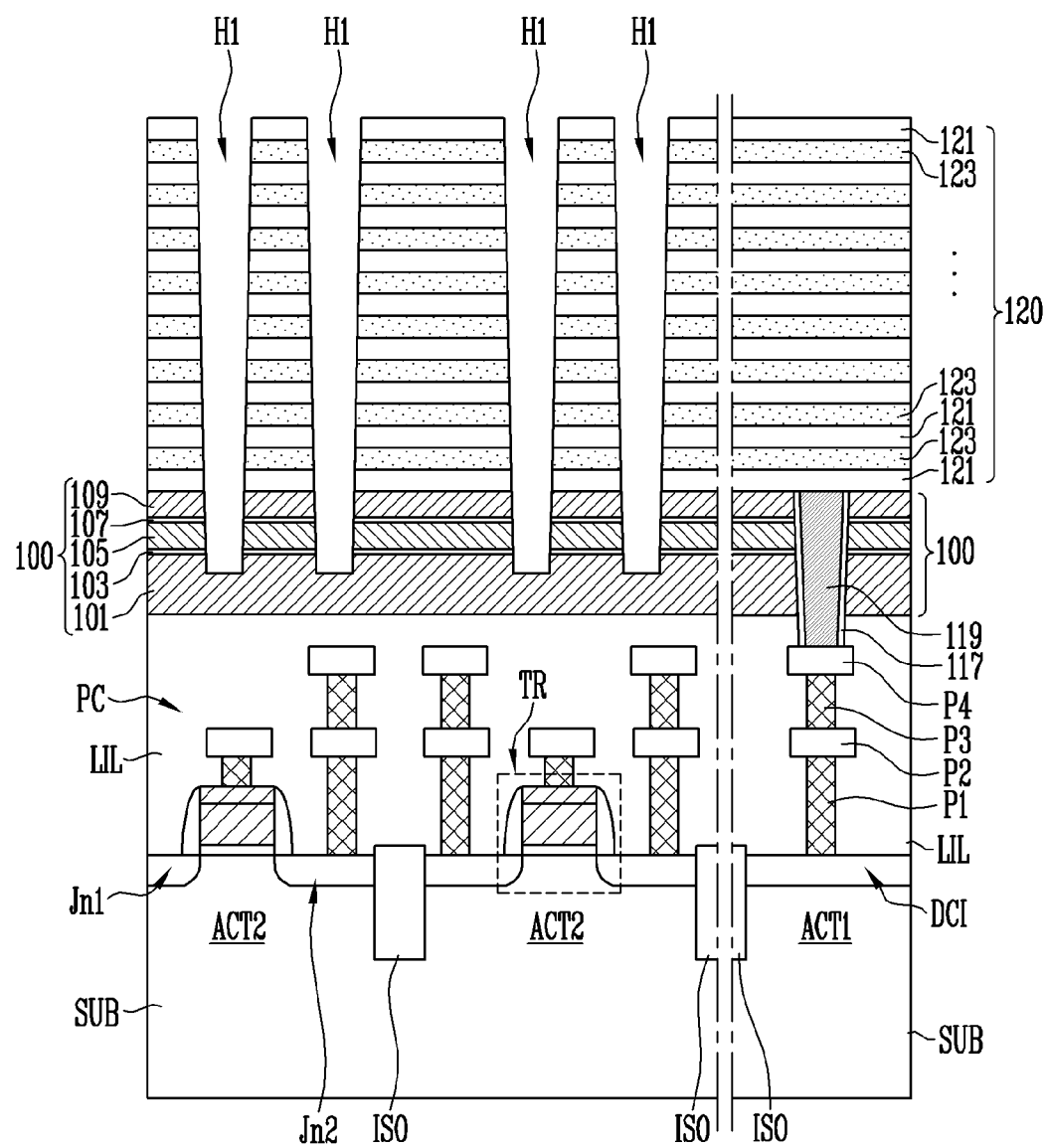

Referring to FIG. 4C, a first upper stacked structure 120 may be formed over the lower stacked structure 100. The first upper stacked structure 120 may include first material layers 121 and second material layers 123 alternately stacked on each other. The first material layers 121 and the second material layers 123 may extend to overlap the conductive pattern 119.

The first material layers 121 and the second material layers 123 may include different materials. According to an embodiment, the first material layers 121 may include an insulating material and the second material layers 123 may include a sacrificial insulating material having a different etch rate from the first material layers 121. For example, each of the first material layers 121 may include a silicon oxide and each of the second material layers 123 may include a silicon nitride.

Subsequently, first channel holes H1 passing through the first upper stacked structure 120 to extend into the lower stacked structure 100 may be formed. The first channel holes H1 may pass through the upper semiconductor layer 109, the second protective layer 107, the sacrificial layer 105, and the first protective layer 103 of the lower stacked structure 100. The first channel holes H1 may extend into the lower semiconductor layer 101 of the lower stacked structure 100.

Figure 4D:
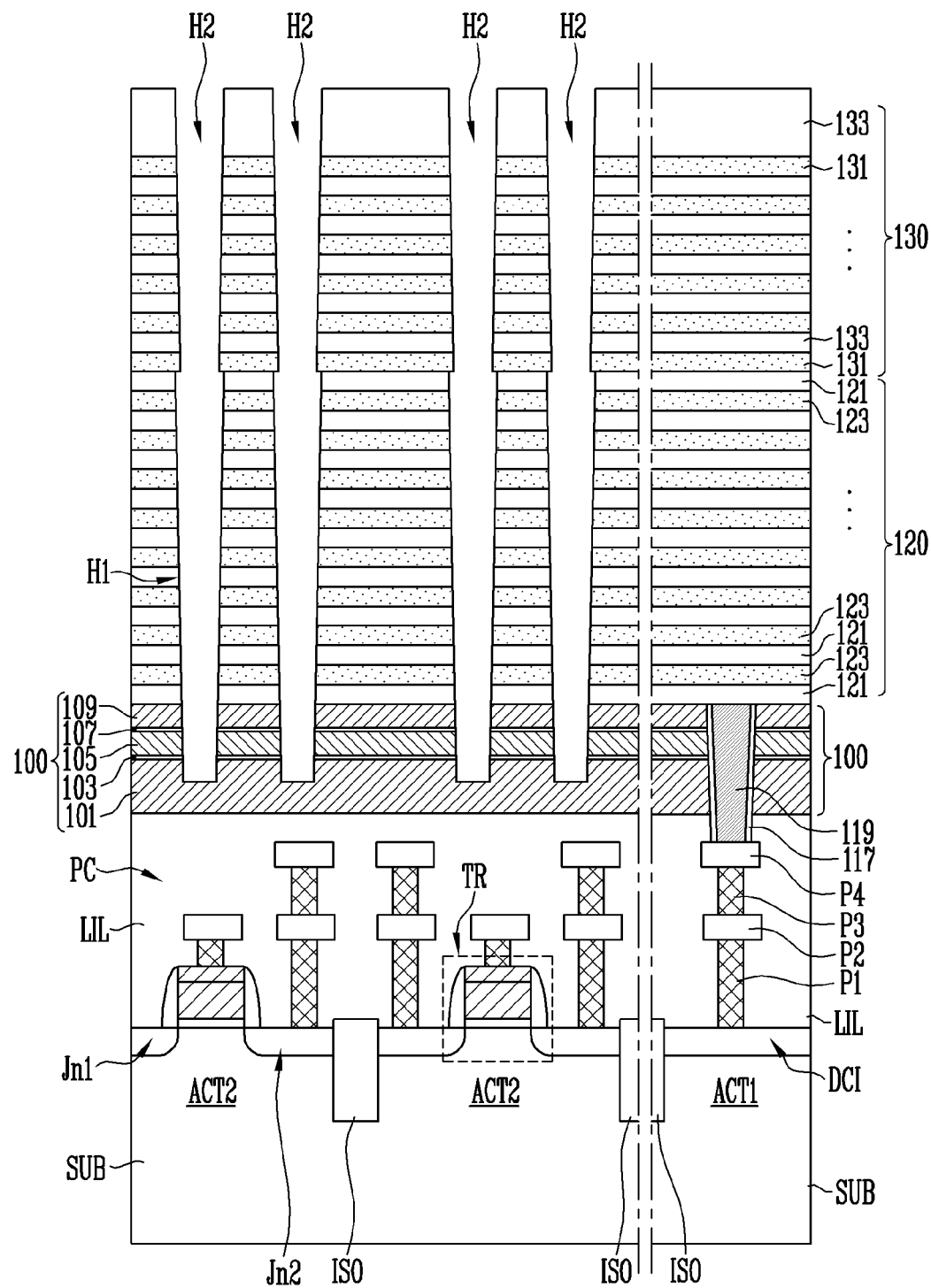

Referring to FIG. 4D, a second upper stacked structure 130 may be formed over the first upper stacked structure 120 after the first channel holes H1 shown in FIG. 4C are filled with a sacrificial layer. The second upper stacked structure 130 may include first material layers 133 and second material layers 131 alternately stacked on each other.

The first material layers 133 and the second material layers 131 may include different materials. According to an embodiment, the first material layers 133 may include an insulating material and the second material layers 131 may include a sacrificial insulating material having a different etch rate from the first material layers 133. For example, each of the first material layers 133 may include a silicon oxide and each of the second material layers 131 may include a silicon nitride. The first material layers 133 of the second upper stacked structure 130 may include the same material as the first material layers 121 of the first upper stacked structure 120. The second material layers 131 of the second upper stacked structure 130 may include the same material as the second material layers 123 of the first upper stacked structure 120.

Subsequently, second channel holes H2 passing through the second upper stacked structure 130 to expose the sacrificial layer that fills the first channel holes H1 shown in FIG. 4C may be formed. Subsequently, the exposed sacrificial layer may be removed. Accordingly, the second channel holes H2 may extend into the first upper stacked structure 120 and the lower stacked structure 100. Each of the second channel holes H2 may have a bottleneck pattern at a boundary between the first upper stacked structure 120 and the second upper stacked structure 130.

Figure 4E:
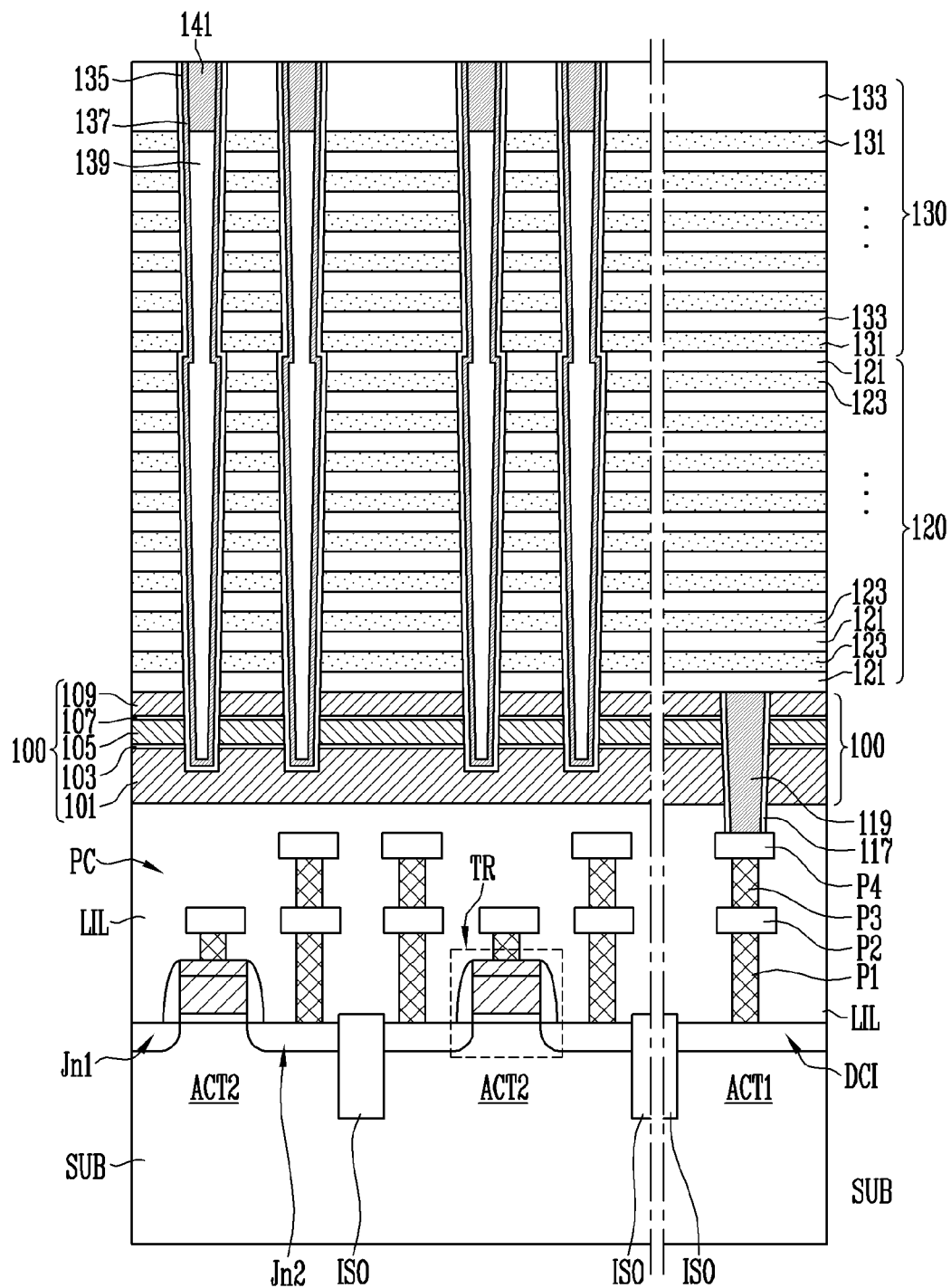

Referring to FIG. 4E, a memory layer 135 may be conformally formed on a surface of each of the second channel holes H2 shown in FIG. 4D. For an embodiment, this means the memory layer 135 follows the contour of each of the second channel holes H2. The memory layer 135 may include a tunnel insulating layer, a data storage layer, and a blocking insulating layer.

A channel semiconductor pattern 137 may be formed in a central region of each of the second channel holes which is opened by the memory layer 135. The channel semiconductor pattern 137 may be formed to have a pillar shape filling the central region of each of the second channel holes which is opened by the memory layer 135. Alternatively, the channel semiconductor pattern 137 may be conformally formed along a surface of the memory layer 135 and may open the central region of each of the second channel holes. The central region of each of the second channel holes which is opened by the channel semiconductor pattern 137 may be filled with a core insulating layer 139. The core insulating layer 139 may be formed to have a height less than that of the channel semiconductor pattern 137 and that of each of the second channel holes. When the core insulating layer 139 has the height less than that of the channel semiconductor pattern 137 and that of each of the second channel holes, a doped semiconductor pattern 141 may be formed on the core insulating layer 139. The doped semiconductor pattern 141 may be surrounded by an upper portion of the channel semiconductor pattern 137 which extends to protrude farther than the core insulating layer 139.

The channel semiconductor pattern 137 may include a silicon layer. The doped semiconductor pattern 141 may include an n-type doped silicon layer. The core insulating layer 139 may include an oxide.

Figure 4F:
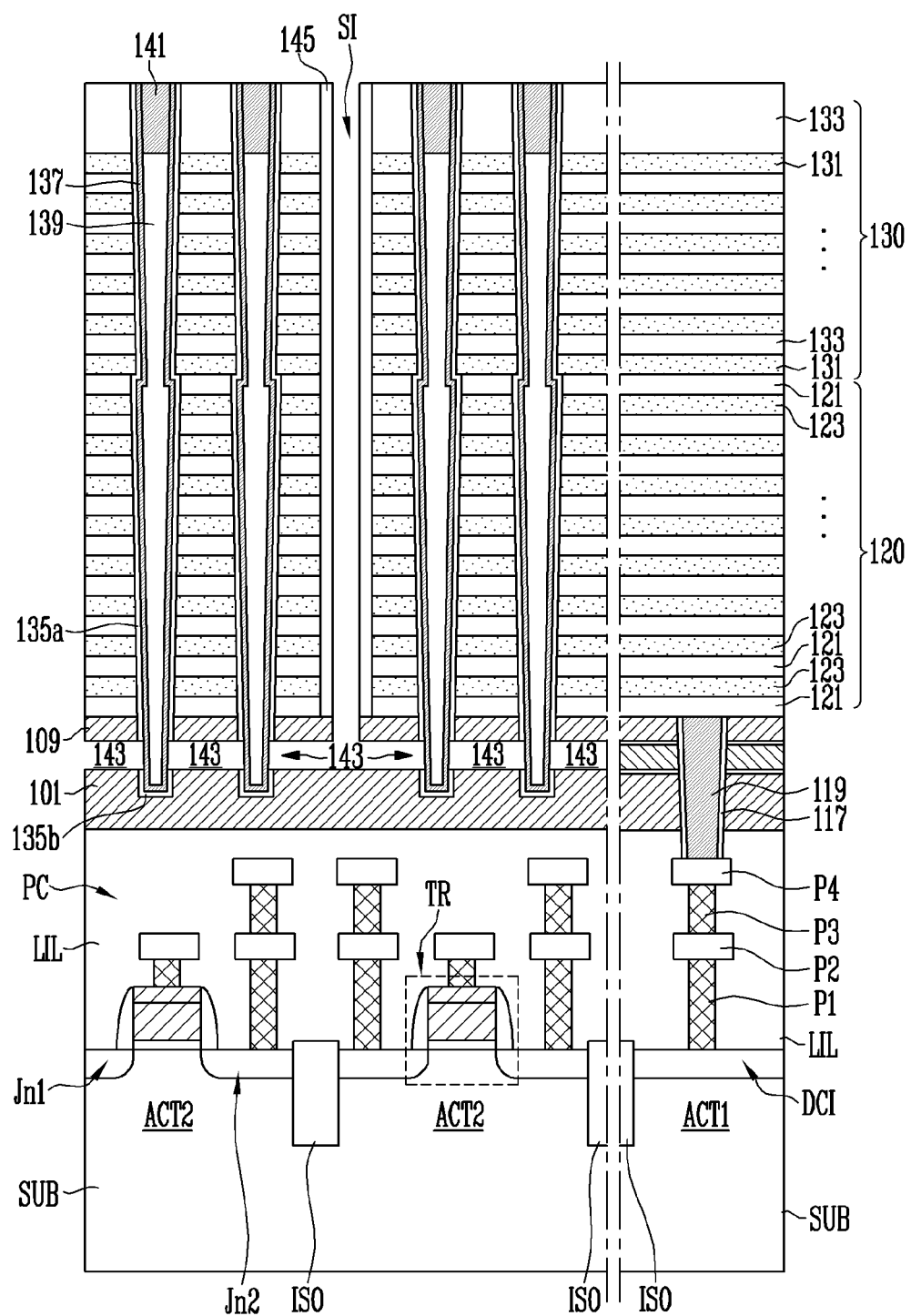

Referring to FIG. 4F, the slit SI passing through the second upper stacked structure 130 and the first upper stacked structure 120 which are formed in the memory cell region may be formed and a sidewall insulating layer 145 may be formed on a sidewall of the slit SI. The sidewall insulating layer 145 may be formed to expose a bottom of the slit SI. The lower stacked structure 100 may be exposed through the bottom of the slit SI which is exposed by the sidewall insulating layer 145.

Subsequently, the upper semiconductor layer 109 and the second protective layer 107 that are exposed through the slit SI may be etched, thereby exposing the sacrificial layer 105 in the memory cell region.

Subsequently, a horizontal space 143 may be formed by removing the sacrificial layer 105 which is exposed. The sacrificial layer 105 in the contact region might not be removed and may remain. The first protective layer and the second protective layer in the memory cell region may prevent a loss of the upper semiconductor layer 109 and the lower semiconductor layer 101 during a process of removing the sacrificial layer 105 in the memory cell region.

According to another embodiment, the sacrificial layer 105 in the contact region may also be removed when the process of removing the sacrificial layer 105 in the memory cell region is performed.

Subsequently, a part of the memory layer which is exposed through the horizontal space 143 may be etched to expose the channel semiconductor pattern 137. The memory layer may be divided into a first memory pattern 135a and a second memory pattern 135b by an etching process.

The first protective layer and the second protective layer in the memory cell region may be removed at the same time during the etching process of the memory layer.

Figure 4G:
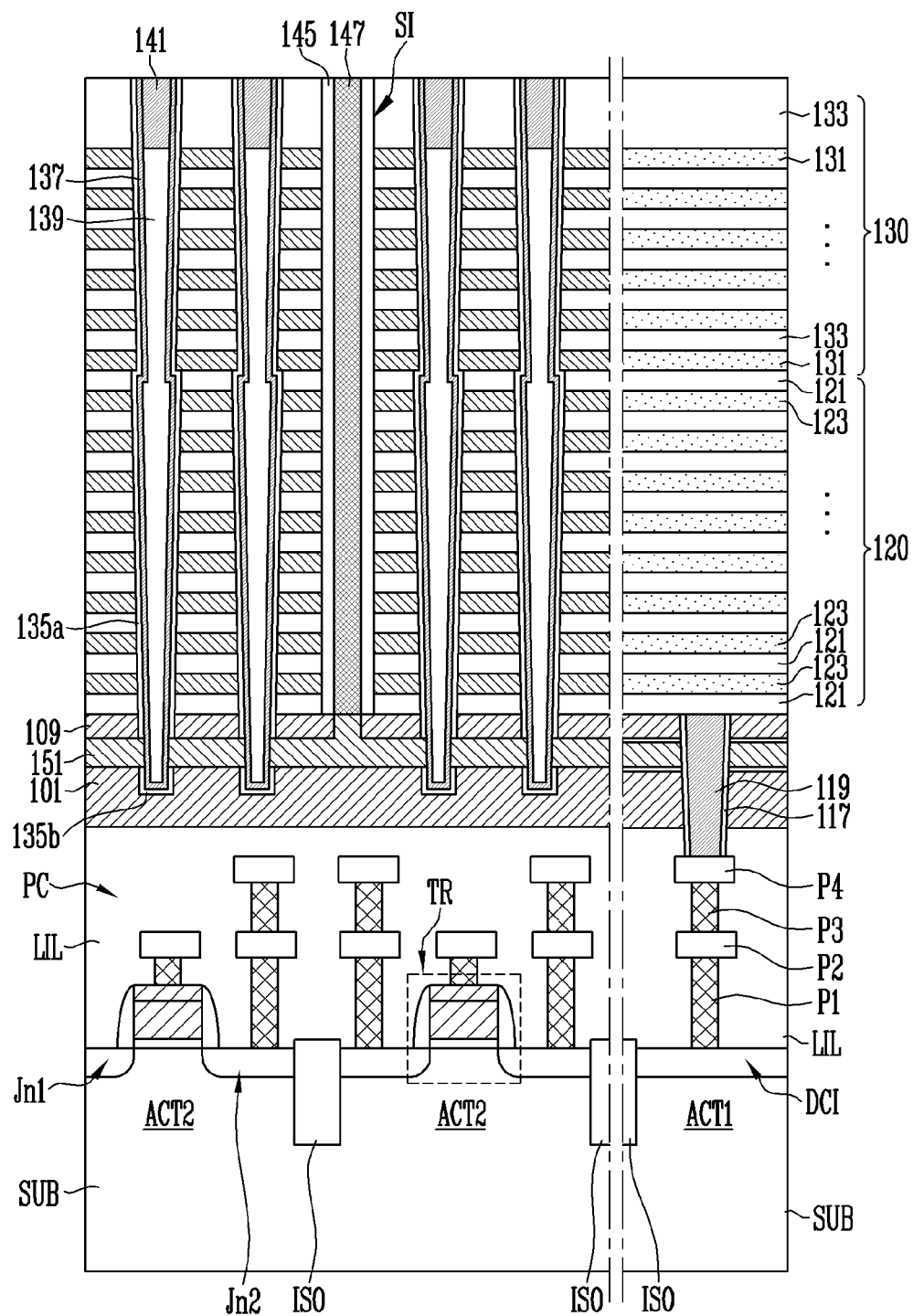

Referring to FIG. 4G, a source semiconductor layer 151 may be formed by introducing a conductive material into the horizontal space 143 shown in FIG. 4F through the slit SI. The source semiconductor layer 151 may contact a sidewall of the channel semiconductor layer 137, the lower semiconductor layer 101, and the upper semiconductor layer 109. The source semiconductor layer 151 may be formed by a chemical vapor deposition method or a growth method using each of the channel semiconductor layer 137, the lower semiconductor layer 101, and the upper semiconductor layer 109 as a seed layer. The source semiconductor layer 151 may include a conductive dopant. For example, the source semiconductor layer 151 may include an n-type doped silicon layer. The conductive dopant in the source semiconductor layer 151 may diffuse, by heat, into the upper semiconductor layer 109 and the channel semiconductor layer 137 that contact the source semiconductor layer 151.

As described above in another embodiment of FIG. 4F, in a case where the sacrificial layer 105 in the contact region is also removed when the process of removing the sacrificial layer 105 in the memory cell region is performed, the source semiconductor layer 151 may be formed to fill a space from which the sacrificial layer 105 is removed.

Subsequently, a source contact structure 147 that contacts the source semiconductor layer 151 and extends along the sidewall insulating layer 145 may be formed by filling the slit SI with a conductive material.

Subsequently, an etching process may be performed to expose a sidewall of each of the first upper stacked structure 120 and the second upper stacked structure 130 that are stacked in the memory cell region and the second material layers of the first upper stacked structure 120 and the second material layers of the second upper stacked structure 130 that are exposed by the etching process may be removed. Subsequently, spaces from which the second material layers of the first upper stacked structure 120 and the second material layers of the second upper stacked structure 130 are removed may be filled with a conductive material, thereby forming gate patterns for word lines.

The semiconductor device according to the embodiment shown in FIGS. 2 and 3 may be formed using processes according to the embodiments shown in FIGS. 4A to 4G.

Figure 5A:
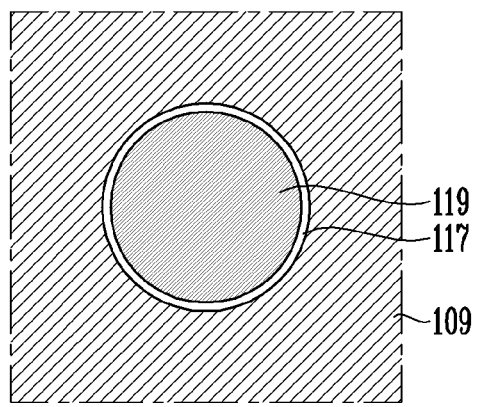
FIGS. 5A to 5C are layout views illustrating various embodiments of a discharge contact.
Figure 5B:
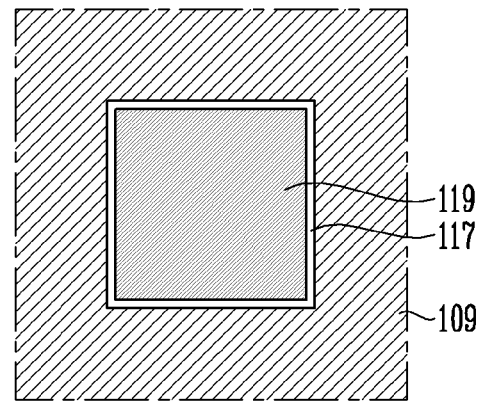
Figure 5C:
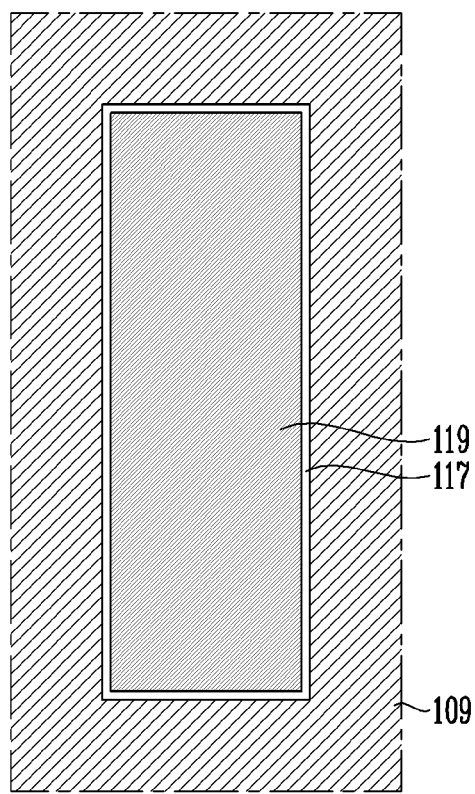

FIGS. 5A to 5C are layout views illustrating various embodiments of a discharge contact.

In the embodiment described above with reference to FIG. 4B, when the process of filling the opening with the dielectric layer 117 and the conductive pattern 119 is performed, a capacitor having one of various patterns according to embodiments shown in FIGS. 5A to 5C may be formed.

For example, when the opening is of a circular hole type, the conductive pattern 119 may be formed to have a circular cross section as shown in FIG. 5A, and the dielectric layer 117 may surround a sidewall of the conductive pattern 119 having the circular cross section. In other words, the conductive pattern 119 may be formed to have a cylindrical or frustum shape and the dielectric layer 117 may surround the sidewall of the conductive pattern 119 having the cylindrical or frustum shape.

In other examples, when the opening is of a square hole type, the conductive pattern 119 may be formed to have a square cross section as shown in FIG. 5B, and the dielectric layer 117 may surround sidewalls of the conductive pattern 119 having the square cross section. In other words, the conductive pattern 119 may be formed to have a square pillar shape and the dielectric layer 117 may surround the sidewalls of the conductive pattern 119.

In other examples, when the opening is of a linear type extending in one direction, the conductive pattern 119 may be formed to have a linear cross section that has a predetermined width as shown in FIG. 5C, and the dielectric layer 117 may surround sidewalls of the conductive pattern 119 having the linear cross section that has the predetermined width. Linear as used herein with respect to the cross-sectional shape of the discharge contact means that a first dimension of the cross-section is substantially longer than a second dimension of the cross-section, as illustrated, for example, in FIG. 5C.

Figure 6:
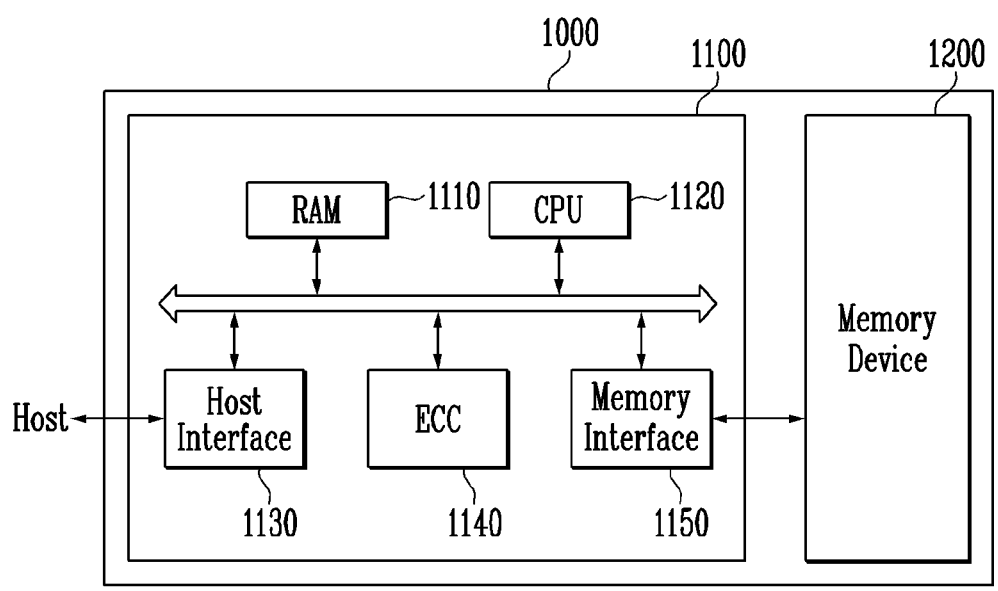
FIG. 6 is a block diagram illustrating a configuration of a memory system according to an embodiment.

FIG. 6 is a block diagram illustrating a configuration of a memory system 1000 according to an embodiment.

Referring to FIG. 6, the memory system 1000 may include a memory device 1200 and a controller 1100.

The memory device 1200 may be used to store data information having various data formats such as a text format, a graphical format, and a software code format. The memory device 1200 may be the semiconductor device described above with reference to FIGS. 1 to 3 and may be manufactured by the manufacturing method described above with reference to FIGS. 4A to 4G. Because the memory device 1200 is configured and manufactured in the same manner as described above, a detailed description thereof will be omitted here.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include Random Access Memory (RAM) 1110, a Central Processing Unit (CPU) 1120, a host interface 1130, an Error Correction Code (ECC) circuit 1140, and a memory interface 1150.

The RAM 1110 may serve as operating memory of the CPU 1120, cache memory between the memory device 1200 and the host, buffer memory between the memory device 1200 and the host, or the like. The RAM 1110 may be replaced with Static Random Access Memory (SRAM), Read Only Memory (ROM), or the like.

The CPU 1120 may control overall operations of the controller 1100. For example, the CPU 1120 may operate firmware such as a Flash Translation Layer (FTL) stored in the RAM 1110.

The host interface 1130 may interface with the host. For example, the controller 1100 may communicate with the host through at least one of various interface protocols such as a Universal Serial Bus (USB) protocol, a MultiMedia Card (MMC) protocol, a Peripheral Component Interconnect (PCI) protocol, a PCI Express (PCI-e) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, and an Integrated Drive Electronics (IDE) protocol, and a private protocol.

The ECC circuit 1140 may detect and correct errors in data read from the memory device 1200 by using an Error Correction Code (ECC).

The memory interface 1150 may interface with the memory device 1200. For example, the memory interface 1150 may include a NAND interface or a NOR interface.

The controller 1100 may further include buffer memory (not illustrated) for temporarily storing data. The buffer memory may be used to temporarily store data to be transferred to an external device through the host interface 1130 or data to be transferred from the memory device 1200 through the memory interface 1150. In addition, the controller 1100 may further include ROM which stores code data to interface with the host.

Because the memory system 1000 includes the memory device 1200 having improved integration density and characteristics, integration density and characteristics of the memory system 1000 may also be improved.

Figure 7:
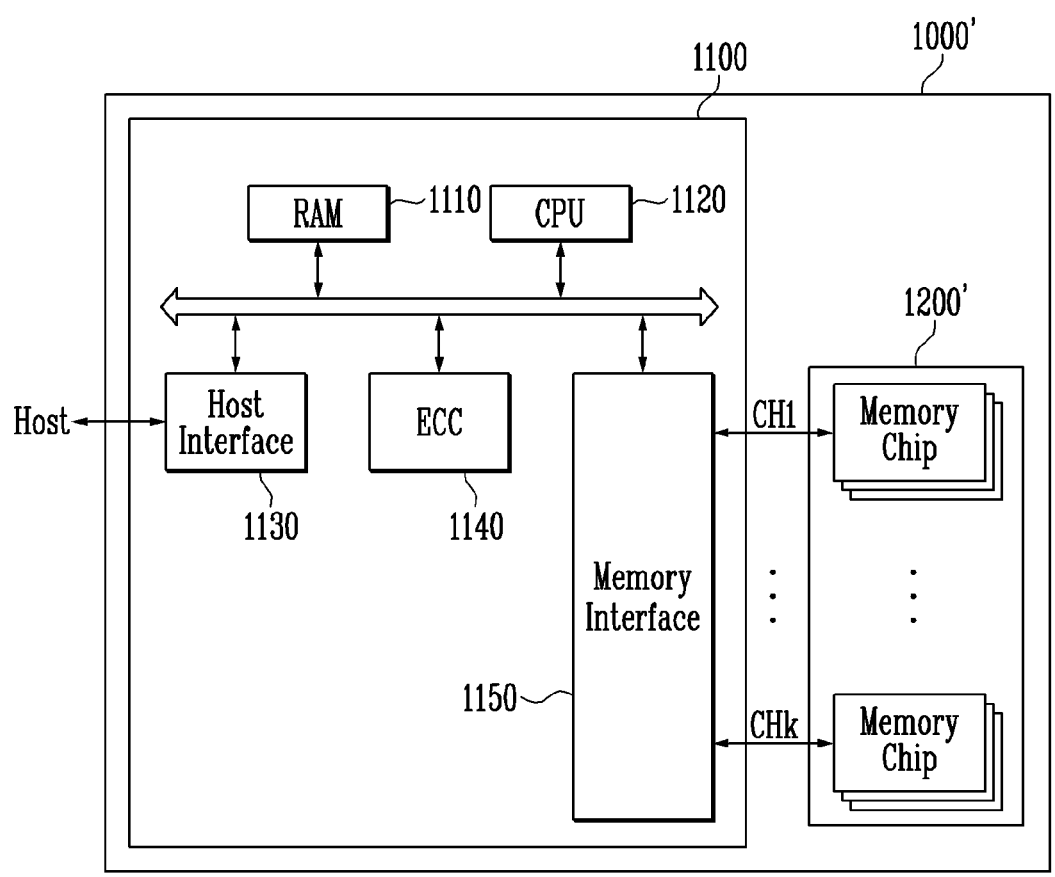
FIG. 7 is a block diagram illustrating a configuration of a memory system according to an embodiment.

FIG. 7 is a block diagram illustrating a configuration of a memory system 1000' according to an embodiment. Hereinafter, any repetitive detailed descriptions of components already mentioned above will be omitted.

Referring to FIG. 7, the memory system 1000' according to an embodiment may include a memory device 1200' and the controller 1100. In addition, the controller 1100 may include the RAM 1110, the CPU 1120, the host interface 1130, the ECC circuit 1140, and the memory interface 1150.

The memory device 1200' may be a non-volatile memory device, may be the semiconductor device described above with reference to FIGS. 1 to 3, and may be manufactured by the manufacturing method described above with reference to FIGS. 4A to 4G. Because the memory device 1200' is configured and manufactured in the same manner as described above, a detailed description thereof will be omitted here.

Furthermore, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips included in a single group may communicate with the controller 1100 through a common channel. The memory system 1000' may be modified such that a single memory chip may be coupled to a single channel.

Because the memory system 1000' includes the memory device 1200' having improved integration density and characteristics, integration density and characteristics of the memory system 1000' may also be improved. In addition, because the memory device 1200' is formed into a multi-chip package, data storage capacity and driving speed of the memory system 1000' may be increased.

Figure 8:
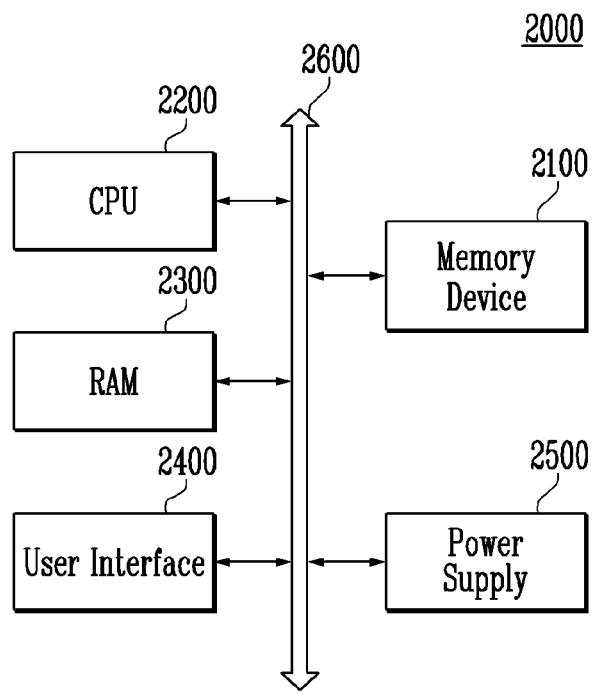
FIG. 8 is a block diagram illustrating a configuration of a computing system according to an embodiment.

FIG. 8 is a block diagram illustrating a configuration of a computing system 2000 according to an embodiment. Hereinafter, any repetitive detailed descriptions of components already mentioned above will be omitted.

Referring to FIG. 8, the computing system 2000 may include a memory device 2100, a Central Processing Unit (CPU) 2200, Random Access Memory (RAM) 2300, a user interface 2400, a power supply 2500, and a system bus 2600.

The memory device 2100 may store data provided via the user interface 2400, data processed by the CPU 2200, or the like. In addition, the memory device 2100 may be electrically coupled to the CPU 2200, the RAM 2300, the user interface 2400, the power supply 2500, and the like through the system bus 2600. For example, the memory device 2100 may be coupled to the system bus 2600 via a controller (not shown), alternatively, directly coupled to the system bus 2600. When the memory device 2100 is directly coupled to the system bus 2600, functions of the controller may be performed by the CPU 2200 and the RAM 2300.

The memory device 2100 may be a non-volatile memory device, may be the semiconductor device described above with reference to FIGS. 1 to 3, and may be manufactured by the manufacturing method described above with reference to FIGS. 4A to 4G. Because the memory device 2100 is configured and manufactured in the same manner as described above, a detailed description thereof will be omitted here.

As described above with reference to FIG. 7, the memory device 2100 may be a multi-chip package including a plurality of memory chips.

The computing system 2000 having the above-mentioned configuration may be provided as one of various elements of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, an RFID device, or the like.

As described above, because the computing system 2000 includes the memory device 2100 having improved integration density and characteristics, characteristics of the computing system 2000 may also be improved.

Figure 9:
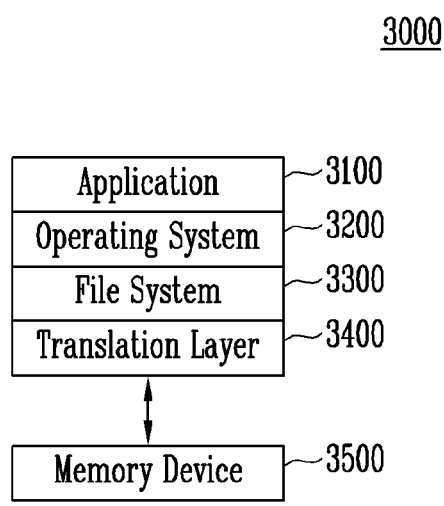
FIG. 9 is a block diagram illustrating a computing system according to an embodiment.

FIG. 9 is a block diagram illustrating a computing system 3000 according to an embodiment.

Referring to FIG. 9, the computing system 3000 may include a software layer which has an operating system 3200, an application 3100, a file system 3300, and a translation layer 3400. In addition, the computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to given rules. The file system 3300 may be determined depending on the operating system 3200 used in the computing system 3000. For example, when the operating system 3200 is a Microsoft Windows-based system, the file system 3300 may be a File Allocation Table (FAT), an NT file system (NTFS), or the like. In addition, when the operating system 3200 is a Unix/Linux-based system, the file system 3300 may be an extended file system (EXT), a Unix File System (UFS), a Journaling File System (JFS), or the like.

FIG. 9 illustrates the operating system 3200, the application 3100, and the file system 3300 in separate blocks. However, the application 3100 and the file system 3300 may be included in the operating system 3200.

The translation layer 3400 may translate an address into a suitable form for the memory device 3500 in response to a request from the file system 3300. For example, the translation layer 3400 may translate a logical address generated by the file system 3300 into a physical address of the memory device 3500. Mapping information of the logical address and the physical address may be stored in an address translation table. For example, the translation layer 3400 may be a Flash Translation Layer (FTL), a Universal Flash Storage Link Layer (ULL), or the like.

The memory device 3500 may be a non-volatile memory device, may be the semiconductor device described above with reference to FIGS. 1 to 3, and may be manufactured by the manufacturing method described above with reference to FIGS. 4A to 4G. Because the memory device 3500 is configured and manufactured in the same manner as described above, a detailed description thereof will be omitted.

The computing system 3000 having the above-described configuration may be divided into an operating system layer that is operated in an upper level region and a controller layer that is operated in a lower level region. The application 3100, the operating system 3200, and the file system 3300 may be included in the operating system layer, and may be driven by operating memory of the computing system 3000. The translation layer 3400 may be included in the operating system layer or the controller layer.

As described above, because the computing system 3000 includes the memory device 3500 having improved integration density and characteristics, characteristics of the computing system 3000 may also be improved.

According to embodiments of the present disclosure, a discharge contact formed in a contact region adjacent to a memory cell region may be utilized as a first electrode for a capacitor, and a source layer surrounding a sidewall of the discharge contact may be utilized as a second electrode for the capacitor. A discharge contact so formed may serve to improve the integration density of a semiconductor device.

What is claimed is:

1. A semiconductor device, comprising:
   a first source layer spaced apart from a substrate and disposed in a memory cell region over the substrate;
   a second source layer spaced apart from the substrate and disposed in a contact region over the substrate;
   a cell stacked structure including interlayer insulating layers and conductive patterns alternately stacked on each other over the first source layer;
   a discharge contact passing through at least a part of the second source layer; and
   a dielectric layer disposed between the second source layer and the discharge contact,
   wherein the second source layer is a first electrode of a capacitor and the discharge contact is a second electrode of the capacitor.

2. The semiconductor device of claim 1, wherein the first source layer is electrically coupled to the second source layer.

3. The semiconductor device of claim 1, wherein the discharge contact has a cylindrical shape, a frustum shape, a square pillar shape, or a linear pillar shape extending into the second source layer.

4. The semiconductor device of claim 1, wherein the dielectric layer surrounds a sidewall of the discharge contact.

5. The semiconductor device of claim 1, further comprising a channel structure passing through the cell stacked structure and extending into the first source layer.

6. The semiconductor device of claim 5, wherein the channel structure comprises:
  a core insulating layer extending in a vertical direction;
  a channel semiconductor layer surrounding a sidewall and a bottom of the core insulating layer;
  a first memory layer surrounding an upper sidewall of the channel semiconductor layer; and
  a second memory layer surrounding a lower sidewall and a bottom of the channel semiconductor layer,
  wherein the first memory layer and the second memory layer are spaced apart from each other to expose a part of a sidewall of the channel semiconductor layer.

7. The semiconductor device of claim 6, wherein the first source layer comprises a first semiconductor layer, a second semiconductor layer, and a third semiconductor layer sequentially stacked on top of each other, and
  wherein the second semiconductor layer contacts the exposed part of the sidewall of the channel semiconductor layer.

8. The semiconductor device of claim 7, wherein the second source layer comprises the first semiconductor layer, a first protective layer, a sacrificial layer, a second protective layer, and the third semiconductor layer sequentially stacked on top of each other.

9. The semiconductor device of claim 1, further comprising a dummy stacked structure including dummy interlayer insulating layers and sacrificial insulating layers alternately stacked on each other over the second source layer.

10. A semiconductor device, comprising:
  a source layer spaced apart from a substrate and disposed in a memory cell region and a contact region of the substrate;
  a cell stacked structure including interlayer insulating layers and conductive patterns alternately stacked on each other over the source layer in the memory cell region;
  a channel structure passing through at least a part of the cell stacked structure and extending into the source layer in the memory cell region;
  an electrode passing through at least a part of the source layer in the contact region; and
  a dielectric layer disposed between the source layer and the electrode.

11. The semiconductor device of claim 10, wherein the electrode has a cylindrical shape, a frustum shape, a square pillar shape, or a linear pillar shape extending into the source layer.

12. The semiconductor device of claim 10, wherein the dielectric layer surrounds a sidewall of the electrode.

13. The semiconductor device of claim 10, further comprising a dummy stacked structure including dummy interlayer insulating layers and sacrificial insulating layers alternately stacked on each other over the source layer in the contact region.

14. A method of manufacturing a semiconductor device, the method comprising:
  forming a source layer over a substrate including a memory cell region and a contact region;
  forming a contact hole passing through the source layer in the contact region;
  forming a dielectric layer on a sidewall of the contact hole;
  filling the contact hole with a conductive material;
  forming a stacked structure in which first material layers and second material layers are alternately stacked on each other over the source layer and the conductive material; and
  forming a plurality of channel holes passing through the stacked structure to extend into the source layer, in the memory cell region,
  wherein the dielectric layer is disposed between the source layer and the conductive material.

15. The method of claim 14, wherein forming the source layer comprises sequentially stacking a first semiconductor layer, a first protective layer, a sacrificial layer, a second protective layer, and a second semiconductor layer over the substrate.

16. The method of claim 15, further comprising:
  forming a channel structure by sequentially stacking a memory layer and a channel semiconductor layer along a sidewall of each of the plurality of channel holes;
  forming a slit passing through the stacked structure, the second semiconductor layer, and the second protective layer to expose the sacrificial layer;
  removing the sacrificial layer exposed through the slit to expose a part of a sidewall of the memory layer;
  etching the exposed part of the sidewall of the memory layer to expose a part of a sidewall of the channel semiconductor layer; and
  forming a third semiconductor layer contacting the exposed part of the sidewall of the channel semiconductor layer by introducing the conductive material through the slit into a space from which the sacrificial layer is removed.

17. The method of claim 16, further comprising:
  etching the stacked structure to expose a sidewall of each of the first material layers and the second material layers;
  removing the second material layers which are exposed; and
  forming conductive patterns in the spaces from which the second material layers are removed.

18. The method of claim 14, wherein the contact hole is formed to have a cross section having a circular shape, a square shape, or a linear shape in a plane parallel to the substrate.

19. The method of claim 14, wherein the dielectric layer is formed to surround a sidewall of the conductive material.

* * * * *